United States Patent
Yano et al.

(10) Patent No.: US 8,164,344 B2
(45) Date of Patent: Apr. 24, 2012

(54) ELECTRIC VEHICLE WITH GROUND FAULT DETECTING SYSTEM

(75) Inventors: Mitsuteru Yano, Tochigi-ken (JP); Toshiaki Takeshita, Tochigi-ken (JP)

(73) Assignee: Honda Motor Co., Ltd., Tokyo (JP)

( * ) Notice: Subject to any disclaimer, the term of this patent is extended or adjusted under 35 U.S.C. 154(b) by 153 days.

(21) Appl. No.: 12/750,214

(22) Filed: Mar. 30, 2010

(65) Prior Publication Data

US 2010/0244849 A1    Sep. 30, 2010

(30) Foreign Application Priority Data

Mar. 31, 2009    (JP) ................. 2009-086728

(51) Int. Cl.
*G01R 31/14* (2006.01)
(52) U.S. Cl. ........................ 324/510; 324/509
(58) Field of Classification Search ............. 324/510, 324/509
See application file for complete search history.

(56) References Cited

U.S. PATENT DOCUMENTS

| | | | | |
|---|---|---|---|---|
| 6,919,726 B2 * | 7/2005 | Yudahira | ............... | 324/522 |
| 7,714,587 B2 * | 5/2010 | Lindsey et al. | ............... | 324/509 |
| 2003/0001580 A1 | 1/2003 | Kang | | |
| 2008/0150549 A1 * | 6/2008 | Horikoshi et al. | ............ | 324/557 |
| 2009/0153156 A1 * | 6/2009 | Ishii | ............... | 324/704 |

FOREIGN PATENT DOCUMENTS

| | | |
|---|---|---|
| JP | 8-70503 | 3/1996 |
| JP | 8-163704 | 6/1996 |
| JP | 8-226950 | 9/1996 |
| JP | 11-218554 | 8/1999 |
| JP | 2006-136151 | 5/2006 |
| JP | 2006343267 | * 12/2006 |
| JP | 2007-147391 | 6/2007 |
| JP | 2008-139249 | 6/2008 |
| JP | 2008-304290 | 12/2008 |

OTHER PUBLICATIONS

Japanese Office Action for Application No. 2009-086728, dated Feb. 15, 2011.

* cited by examiner

*Primary Examiner* — Jeff Natalin
(74) *Attorney, Agent, or Firm* — Nelson Mullins Riley & Scarborough LLP; Anthony A. Laurentano (57) ABSTRACT

An electric vehicle incorporates a ground fault detecting system for preventing a ground fault detector from detecting a ground fault in error. First and second ground fault detectors are associated respectively with first and second ungrounded power supplies which generate respective different voltages. Since the first and second ground fault detectors are activated in different periods, the ground fault detecting system prevents a ground fault from being detected in error.

5 Claims, 13 Drawing Sheets

ELECTRIC VEHICLE WITH GROUND FAULT DETECTING SYSTEM

CROSS-REFERENCE TO RELATED APPLICATION

This application is based upon and claims the benefit of priority from Japanese Patent Application No. 2009-086728 filed on Mar. 31, 2009, of which the contents are incorporated herein by reference.

BACKGROUND OF THE INVENTION

1. Field of the Invention

The present invention relates to an electric vehicle having a ground fault detecting system for detecting a ground fault or an insulated state of an ungrounded power supply with respect to a grounded region (ground) of the electric vehicle.

2. Description of the Related Art

Generally, electric vehicles carry a power supply having a high voltage, which is of 200 [V] or higher, for example, insulated from the vehicle body as an ungrounded power supply.

There have been proposed technologies for detecting a ground fault (including a ground leakage or a lowered insulation resistance value due to a deteriorated insulation) of such a high-voltage ungrounded power supply (see, for example, Japanese Laid-Open Patent Publication No. 08-226950, Japanese Laid-Open Patent Publication No. 08-070503, and Japanese Laid-Open Patent Publication No. 11-218554).

According to the technology disclosed in Japanese Laid-Open Patent Publication No. 08-226950, a ground fault of a single ungrounded power supply is detected and determined by a DC ground fault detecting system.

According to the technologies disclosed in Japanese Laid-Open Patent Publication No. 08-070503 and Japanese Laid-Open Patent Publication No. 11-218554, a ground fault of a single ungrounded power supply is detected and determined by an AC ground fault detecting system.

Nowadays, there have been proposed electric vehicles which have a load energizable by a first ungrounded power supply such as a fuel cell and a second ungrounded power supply such as an electric energy storage, e.g., a battery or the like. However, no ground fault detecting system has been known in the art for use on such electric vehicles including first and second ungrounded power supplies.

SUMMARY OF THE INVENTION

It is an object of the present invention to provide an electric vehicle having a ground fault detecting system which is suitable for use on electric vehicles including first and second ungrounded power supplies, and which is capable of preventing a ground fault from being detected in error.

An electric vehicle according to the present invention incorporates therein a ground fault detecting system, which includes a load, a first ungrounded power supply having a voltage (E1) for supplying electric power to the load, a converter having input and output terminals connected between the load and the first ungrounded power supply, and a second ungrounded power supply having a voltage (E2) lower than the voltage (E1) of the first ungrounded power supply (E2<E1) and which is connected to other input and output terminals of the converter.

The ground fault detecting system includes a first ground fault detector for detecting a ground fault of the first ungrounded power supply based on a change in a circuit impedance before and after a first switch is opened and closed, the first ground fault detector having a first insulation resistor inserted between the first ungrounded power supply and a grounded region, the first insulation resistor being connected to an end of a first detection resistor through the first switch, the first detection resistor having another end connected to the grounded region or an AC signal source which generates an AC signal, a second ground fault detector for detecting a ground fault of the second ungrounded power supply based on a change in a circuit impedance before and after a second switch is opened and closed, the second ground fault detector having a second insulation resistor inserted between the second ungrounded power supply and the grounded region, the second insulation resistor being connected to an end of a second detection resistor through the second switch, the second detection resistor having another end connected to the grounded region or the AC signal source, and a switch controller for performing an exclusive switch control process for inhibiting the second switch from being closed when the first switch is closed and inhibiting the first switch from being closed when the second switch is closed.

According to the present invention, the first and second ground fault detectors are associated respectively with the first and second ungrounded power supplies which generate respective different voltages. Since the first and second ground fault detectors are activated in different periods, the ground fault detecting system is capable of preventing a ground fault from being detected in error.

Each of the first and second ground fault detectors comprises an AC ground fault detector for detecting a ground fault based on an amplitude change of the AC signal depending on the resistance value of the insulation resistor.

Alternatively, each of the first and second ground fault detectors comprises a DC ground fault detector for measuring a voltage change or a current change depending on the resistance value of the insulation resistor when the first detection resistor is connected to the first ungrounded power supply or the second detection resistor is connected to the second ungrounded power supply.

According to the present invention, since the first and second ground fault detectors that are associated respectively with the first and second ungrounded power supplies of the electric vehicle are activated in different periods, the ground fault detecting system is capable of preventing a ground fault from being detected in error.

The first ungrounded power supply may comprise a fuel cell, for example, and the second ungrounded power supply may comprise an electric energy storage, for example.

The above and other objects, features, and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Electric vehicles incorporating a ground fault detecting system according to preferred embodiments of the present invention will be described below with reference to the drawings.

Figure 1:
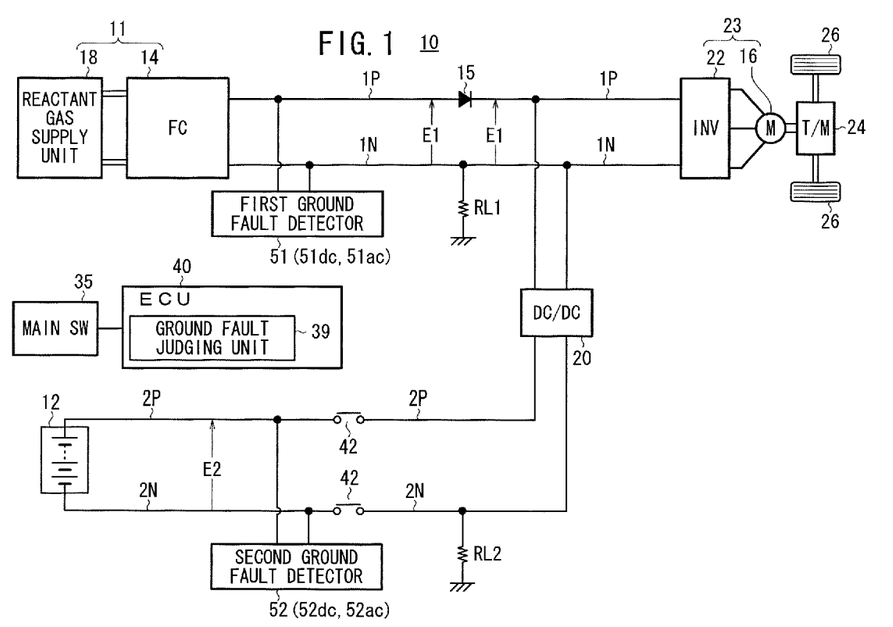
FIG. 1 is a block diagram of an electric vehicle incorporating a ground fault detecting system according to an embodiment of the present invention.

FIG. 1 shows in block form an electric vehicle 10 incorporating a ground fault detecting system according to an embodiment of the present invention.

As shown in FIG. 1, the electric vehicle 10 basically comprises a hybrid DC power supply apparatus including a fuel cell 14 (hereinafter also referred to as "first ungrounded power supply 14") which serves as a first ungrounded power supply (first DC power supply) for generating a voltage $E1$ between first main circuit lines 1P, 1N and a battery 12 (an electric energy storage, hereinafter also referred to as "second ungrounded power supply 12") which serves as a second ungrounded power supply (second DC power supply) for generating a voltage $E2$ ($E1 > E2$) between second main circuit lines 2P, 2N, and a motor 16 as a load for propelling the electric vehicle 10, the motor 16 being supplied with electric power from the hybrid DC power supply apparatus through an inverter 22. A diode 15 for preventing an electric current from flowing into the fuel cell 14 is connected between the fuel cell 14 and the inverter 22.

The fuel cell 14 is of a stacked structure made up of a plurality of cells each comprising a solid polymer electrolyte membrane sandwiched between an anode and a cathode which are disposed one on each side of the solid polymer electrolyte membrane. The fuel cell 14 is connected to a reactant gas supply unit 18 by pipes. The reactant gas supply unit 18 includes a hydrogen tank (not shown) for storing hydrogen (a fuel gas) as a reactant gas and a compressor (not shown) for compressing air (an oxygen-containing gas) as another reactant gas. When the reactant gas supply unit 18 supplies the fuel cell 14 with hydrogen and air, these reactant gases cause an electrochemical reaction in the fuel cell 14, generating an electric current that is supplied to the motor 16 and the battery 12.

The fuel cell 14 and the reactant gas supply unit 18 jointly make up a fuel cell system 11 which includes an ECU (Electronic Control Unit) 40 (controller) for controlling the electric vehicle 10 as a whole, including the fuel cell 14 and the reactant gas supply unit 18.

A DC/DC converter 20 comprises a chopper-type voltage converter having a set of terminals connected to the battery 12 through the second main circuit lines 2P, 2N and switches 42 and another set of terminals connected to the fuel cell 14 and the motor 16 through the first main circuit lines 1P, 1N.

Figure 2:
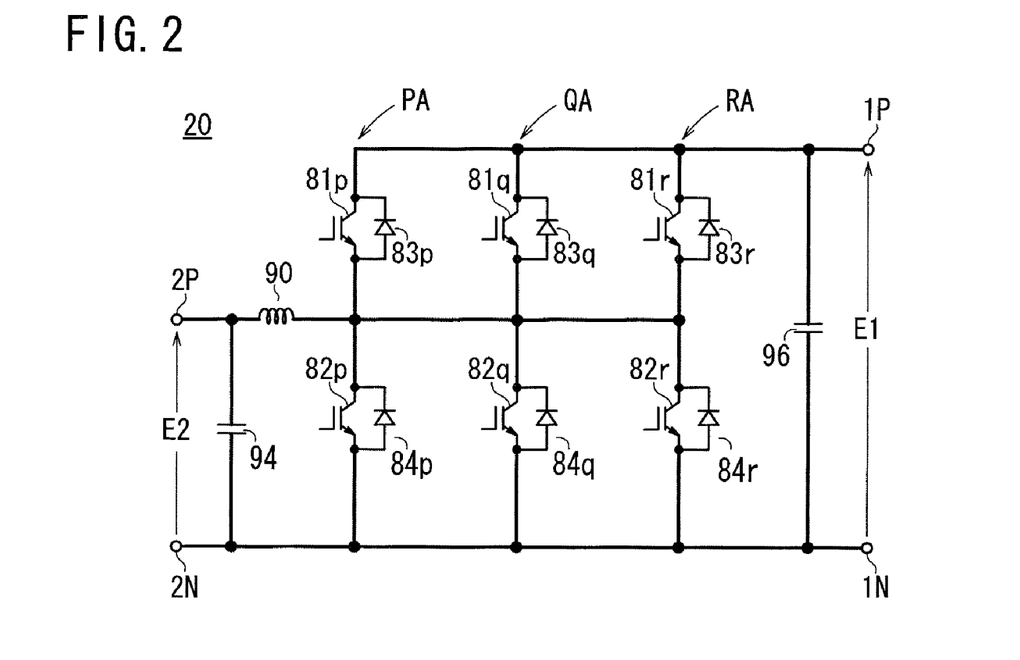
FIG. 2 is a circuit diagram of a DC/DC converter of the electric vehicle.

FIG. 2 is a circuit diagram of the DC/DC converter 20.

As shown in FIG. 2, the DC/DC converter 20 serves as a buck-boost converter for converting (increasing) the voltage $E2$ of the battery 12 to the voltage $E1$ ($E2 < E1$) of the fuel cell 14 side and converting (reducing) the voltage $E1$ of the fuel cell 14 to the voltage $E2$ of the battery 12 side.

The DC/DC converter 20 comprises three-phase phase arms PA, QA, RA energizable by the ECU 40, and a reactor 90.

The P-phase arm PA comprises upper arm elements (an upper arm switching element 81$p$ and a diode 83$p$) and lower arm elements (a lower arm switching element 82$p$ and a diode 84$p$).

The Q-phase arm QA comprises upper arm elements (an upper arm switching element 81$q$ and a diode 83$q$) and lower arm elements (a lower arm switching element 82$q$ and a diode 84$q$).

The R-phase arm RA comprises upper arm elements (an upper arm switching element 81$r$ and a diode 83$r$) and lower arm elements (a lower arm switching element 82$r$ and a diode 84$r$).

The upper arm switching elements 81$p$, 81$q$, 81$r$ and the lower arm switching elements 82$p$, 82$q$, 82$r$ comprise MOSFETs, IGBTs, or the like, respectively, for example.

The reactor 90 is inserted between midpoints (common junctions) of the phase arms PA, QA, RA and the positive terminal of the battery 12. The reactor 90 discharges and stores energy when the DC/DC converter 20 converts between the voltage $E2$ and the voltage $E1$.

Smoothing capacitors 94, 96 are connected between the second main circuit lines 2P, 2N and the first main circuit lines 1P, 1N, respectively.

The arm switching elements 81$p$, 81$q$, 81$r$, 82$p$, 82$q$, 82$r$ are selectively turned on and off by the levels of gate drive signals (drive voltages) that are supplied from the ECU 40. The DC/DC converter 20 operates in an alternate three-phase arm drive mode or a simultaneous all-phase arm drive mode.

Figure 3:
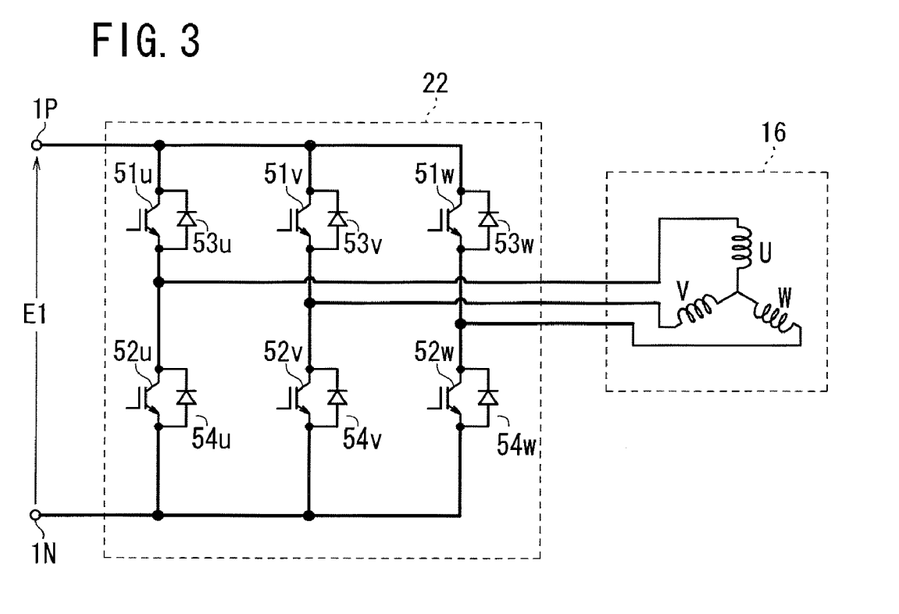
FIG. 3 is a circuit diagram of an inverter of the electric vehicle.

FIG. 3 is a circuit diagram of the inverter 22. As shown in FIG. 3, the inverter 22, which is of a three-phase full-bridge configuration, performs AC/DC conversions. Specifically, the inverter 22 converts a DC (direct current) from the hybrid DC power supply apparatus to a three-phase AC (alternating current) and supplies the three-phase AC to the U-phase coil, V-phase coil, and W-phase coil of the motor 16, and also converts a three-phase AC generated by the motor 16 in a regenerative mode to a DC and supplies the DC from the first main circuit lines 1P, 1N through the DC/DC converter 20 to the second main circuit lines 2P, 2N, charging the battery 12.

The inverter 22 comprises switching elements 51$u$, 51$v$, 51$w$, 52$u$, 52$v$, 52$w$, which comprise MOSFETs, IGBTs, or the like, respectively, energizable by the ECU 40, and diodes 53$u$, 53$v$, 53$w$, 54$u$, 54$v$, 54$w$ reverse-connected across the switching elements 51$u$, 51$v$, 51$w$, 52$u$, 52$v$, 52$w$, respectively.

As shown in FIG. 1, when energized, the motor 16 causes a transmission 24 to rotate wheels 26 of the electric vehicle 10. The inverter 22 and the motor 16 will collectively be referred to as a load 23.

The high-voltage battery 12 which is connected between the second main circuit lines 2P, 2N through the switches 42 is a high-voltage battery serving as an electric energy storage which may comprise a lithium ion secondary cell, a capacitor, or the like. In the present embodiment, the battery 12 comprises a lithium ion secondary cell.

The ECU 40 comprises a microcomputer or the like for generally controlling the electric vehicle 10 in its entirety including the fuel cell system 11, the switches 42, the DC/DC converter 20, the load 23, first and second ground fault detectors 51, 52 to be described later, and the like. A main switch (power supply switch) 35 is connected to the ECU 40. The main switch 35 serves as an ignition switch for turning on (activating or starting) and turning off (deactivating) the electric vehicle 10 and the fuel cell system 11.

The first ground fault detector 51 for detecting a ground fault of the fuel cell 14, the inverter 22, and the motor 16 that are connected to the first main circuit lines 1P, 1N based on an insulation resistance value is connected between the first main circuit lines 1P, 1N. A second ground fault detector 52 for detecting a ground fault of the battery 12 that is connected to the second main circuit lines 2P, 2N based on an insulation resistance value is connected between the second main circuit lines 2P, 2N.

The ECU 40 has a ground fault judging unit 39 (comparing unit) as a functional means. The first and second ground fault detectors 51, 52 and the ECU 40 with the ground fault judging unit 39 basically make up the ground fault detecting system according to the present embodiment.

The first and second ground fault detectors 51, 52 comprise first and second DC ground fault detectors 51*dc*, 52*dc*, respectively, according to a DC ground fault detecting system or first and second AC ground fault detectors 51*ac*, 52*ac*, respectively, according to an AC ground fault detecting system, as described later.

Figure 4:
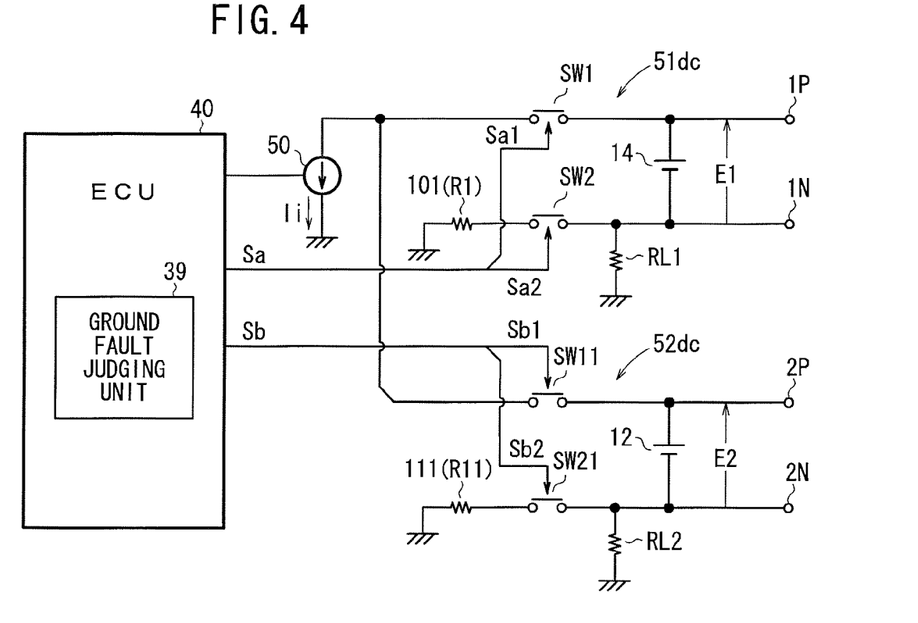
FIG. 4 is a circuit diagram of DC ground fault detectors of the ground fault detecting system.

FIG. 4 is a circuit diagram of the first and second DC ground fault detectors 51*dc*, 52*dc* of the ground fault detecting system. The first and second ground fault detectors 51, 52 have identical circuit arrangements, and share a DC ammeter 50 (DC current sensor) for measuring a ground fault current (leakage current) Ii.

In the present embodiment, the first and second ground fault detectors 51, 52 employ the DC ammeter 50 for an easier understanding of the invention. However, the first and second ground fault detectors 51, 52 may be of another DC ground fault detecting scheme employing a DC voltmeter (DC voltage sensor) for measuring a voltage at which a capacitor is charged for a given period of time, as disclosed in Japanese Laid-Open Patent Publication No. 08-226950.

In the present embodiment, furthermore, as shown in FIGS. 1 and 4, a first insulation resistor RL1 (whose resistance value is also indicated by RL1) and a second insulation resistor RL2 (whose resistance value is also indicated by RL2) are connected between the first main circuit line 1N and a grounded region (vehicle body) and between the second main circuit line 2N and the grounded region for an easier understanding of the invention. However, the ground fault detecting system may have its circuit arrangement changed so as to detect insulation resistances between the first main circuit line 1P near the fuel cell 14 and the grounded region (or between the first main circuit line 1P near the input of the inverter 22 and the grounded region) and between the second main circuit line 2P and the grounded region, or between one of the stacked cells of the fuel cell 14 and the grounded region and between one of the series-connected unit cells of the battery 12 and the grounded region, or between the phase coils of the motor 16 and the grounded region.

As shown in FIG. 4, a switch SW1 and a switch SW2 (first switch) have ends connected respectively to the first main circuit lines 1P, 1N which are connected to the fuel cell 14. The other end of the switch SW1 is connected to the DC ammeter 50 for measuring the ground fault current Ii. The ground fault current Ii measured by the DC ammeter 50 is read by the ECU 40. The other end of the switch SW2 is connected to an end of a first detection resistor 101 having a resistance value R1. The other end of the first detection resistor 101 is connected to the grounded region. Since the potential at the grounded region remains unchanged, its output impedance is considered to be constant.

A switch SW11 and a switch SW21 (second switch) have ends connected respectively to the second main circuit lines 2P, 2N which are connected to the battery 12. The other end of the switch SW11 is connected to the DC ammeter 50 for measuring the ground fault current Ii. The ground fault current Ii measured by the DC ammeter 50 is read by the ECU 40. The other end of the switch SW21 is connected to an end of a second detection resistor 111 having a resistance value R11. The other end of the second detection resistor 111 is connected to the grounded region.

The switches SW1, SW2, SW11, SW21 are selectively opened and closed under the control of operation signals Sa (Sa1, Sa2), Sb (Sb1, Sb2) from the ECU 40 which also functions as a switch controller.

Operation of the first and second DC ground fault detectors 51*dc*, 52*dc* according to the present embodiment which does not cause an erroneous ground fault detection will be described below with reference to a timing chart shown in FIG. 5 in comparison with operation of a ground fault detecting system according to the related art which tends to cause an erroneous ground fault detection.

Figure 5:
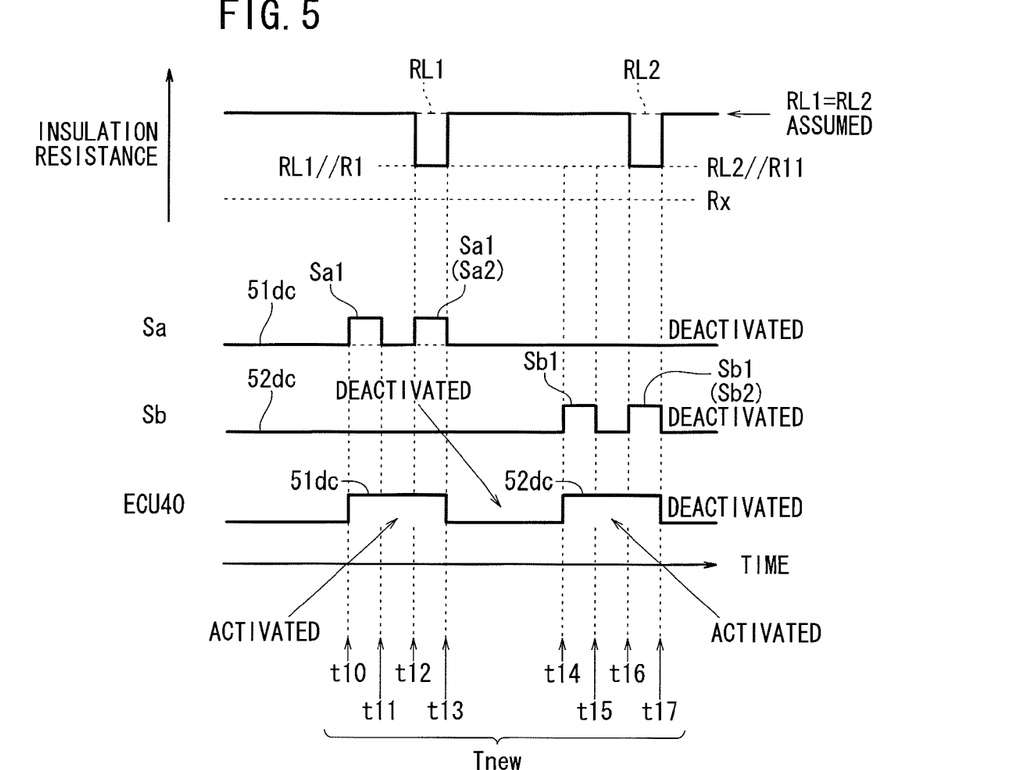
FIG. 5 is a timing chart illustrative of the manner in which the DC ground fault detectors operate at the time of a normal ground fault detection.

As shown in FIG. 5, in a period from time t10 to time t13 within a ground fault detection period Tnew from time t10 to time t17, the first DC ground fault detector 51*dc* is activated by the operation signals Sa (Sa1, Sa2) from the ECU 40 to measure the first insulation resistance value RL1. In a different period from time t14 to time t17 within the ground fault detection period Tnew, the second DC ground fault detector 52*dc* is activated by the operation signals Sb (Sb1, Sb2) from the ECU 40 to measure the second insulation resistance value RL2.

Figure 6:
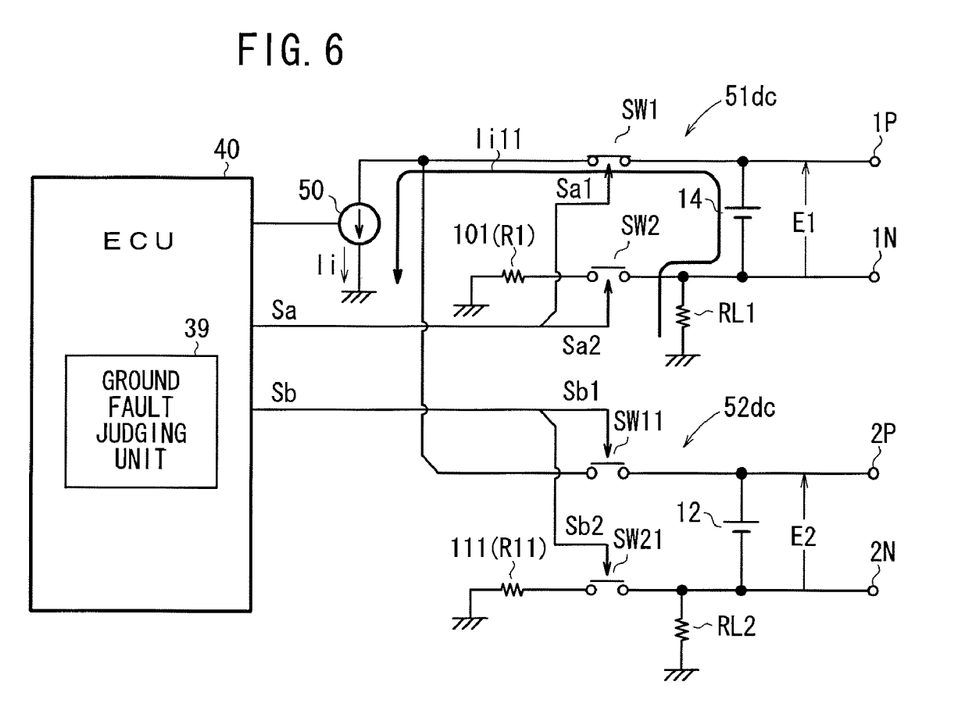
FIG. 6 is a circuit diagram illustrative of the manner in which the DC ground fault detectors operate at the time of a normal ground fault detection.

For an easier understanding of the invention, it is assumed that the first and second insulation resistance values RL1, RL2 are identical to each other. When the switch SW1 is closed by the operation signal Sa1 between time t10 and time t11, an electric current Ii11 indicated by the equation (1) shown below flows through the first insulation resistor RL1 along a path shown in FIG. 6. The electric current Ii11 is measured by the DC ammeter 50 and its measured value is stored in a memory of the CPU 40.

$$E1/RL1 = Ii11 \quad (1)$$

Figure 7:
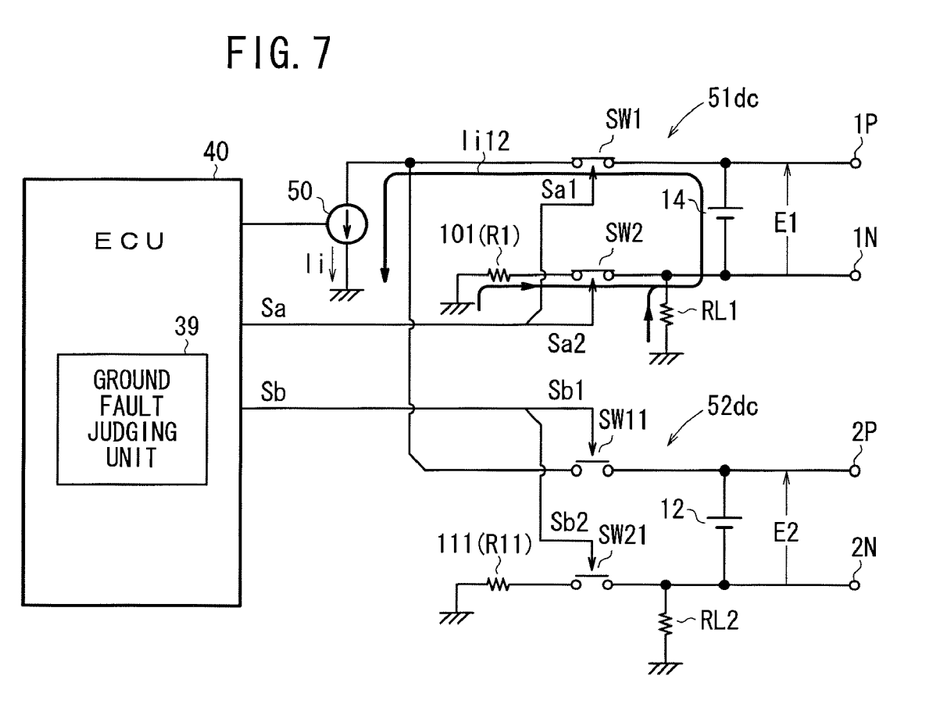
FIG. 7 is a circuit diagram illustrative of the manner in which the DC ground fault detectors operate at the time of a normal ground fault detection.

When the switch SW2 is then closed by the operation signal Sa2 between time t12 and time t13, an electric current Ii12 indicated by the equation (2) shown below flows through the first insulation resistor RL1 and the first detection resistor 101 which is connected parallel to the first insulation resistor RL1 along a path shown in FIG. 7. The electric current Ii12 is measured by the DC ammeter 50 and its measured value is stored in the memory of the CPU 40.

$$E1/(RL1//R1) = Ii12 \quad (2)$$

In the equation (2) and other equations and descriptions, the symbol "//" represents a parallel connection.

By solving the equations (1), (2) for the first insulation resistance value RL1, the ECU 40 can measure the first insulation resistance value RL1 according to the following equation (3):

$$RL1=R1\{(Ii12/Ii11)-1\} \quad (3)$$

The ground fault judging unit 39 compares the measured first insulation resistance value RL1, i.e., a parallel resistance value RL1//R1 shown in FIG. 5 according to the present embodiment, with an abnormal detection threshold value Rx. If the parallel resistance value RL1//R1 is greater than the abnormal detection threshold value Rx, then the ground fault judging unit 39 judges that there is no ground fault. If the parallel resistance value RL1//R1 is smaller than the abnormal detection threshold value Rx, then the ground fault judging unit 39 judges that there is a ground fault.

Similarly, within the ground fault detection period Tnew from time t10 to time t17, the second DC ground fault detector 52dc is activated by the operation signals Sb (Sb1, Sb2) from the ECU 40 in a different period, from time t14 to time t17 to measure the second insulation resistance value RL2. The second insulation resistance value RL2 is measured according to the equations (4) through (6) shown below, which correspond to the equations (1) through (3), respectively. The ground fault judging unit 39 compares the measured second insulation resistance value RL2 with the abnormal detection threshold value Rx to determine whether there is a ground fault or not.

$$E2/RL2=Ii21 \quad (4)$$

$$E2/(RL2//R2)=Ii22 \quad (5)$$

$$RL2=R2\{(Ii22/Ii21)-1\} \quad (6)$$

The abnormal detection threshold value Rx may be different values with the first ungrounded power supply 14 (voltage E1) and the second ungrounded power supply 12 (voltage E2, E2<E1), which make their leakage currents identical to each other.

Figure 8:
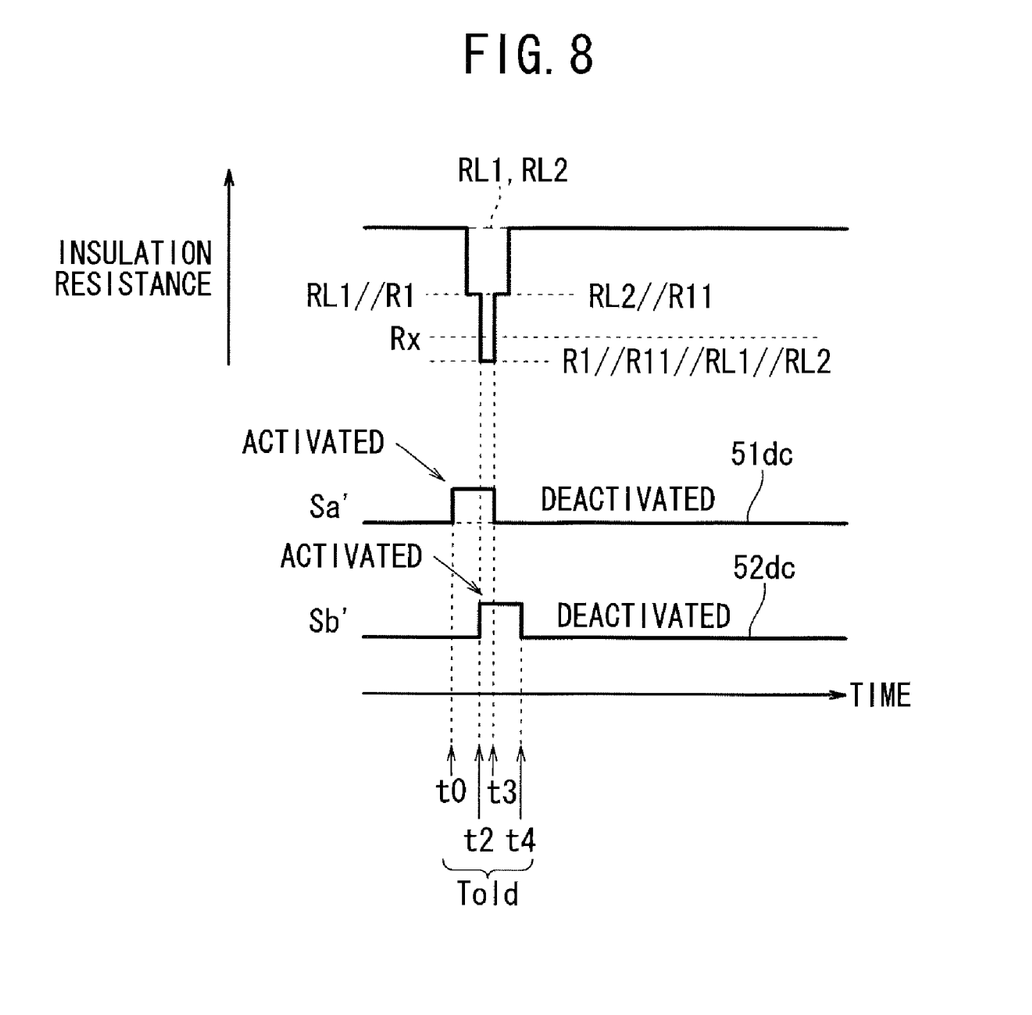
FIG. 8 is a timing chart illustrative of the manner in which the DC ground fault detectors operate at the time of an erroneous ground fault detection.
Figure 9:
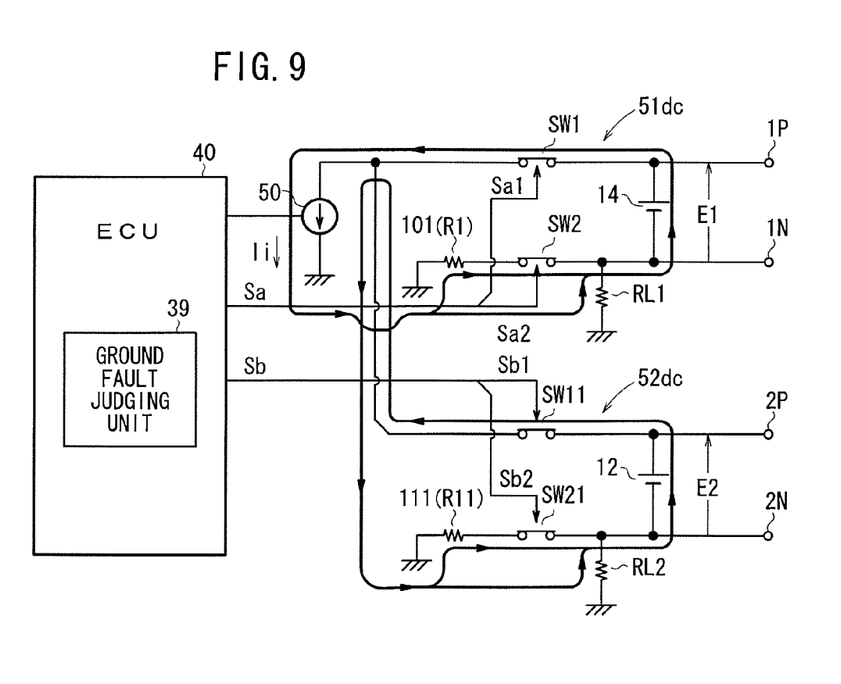
FIG. 9 is a circuit diagram illustrative of the manner in which the DC ground fault detectors operate at the time of an erroneous ground fault detection.

If the switches SW1, SW2, SW11, SW21 are not controlled in coordination by the ECU 40 as described above, then all the switches SW1, SW2, SW11, SW21 may be closed (see FIG. 9) in a period from time t2 to time t3 shown in FIG. 8, causing a combined current based on the parallel resistance value R1//R11//RL1//RL2 to flow through the DC ammeter 50. In this case, even though no ground fault occurs, the insulation resistance value (combined insulation resistance value) becomes smaller than the abnormal detection threshold value Rx, and the ground fault judging unit 39 detects a ground fault in error.

The first and second AC ground fault detectors 51ac, 52ac will be described below with respect to their arrangement and operation.

Figure 10:
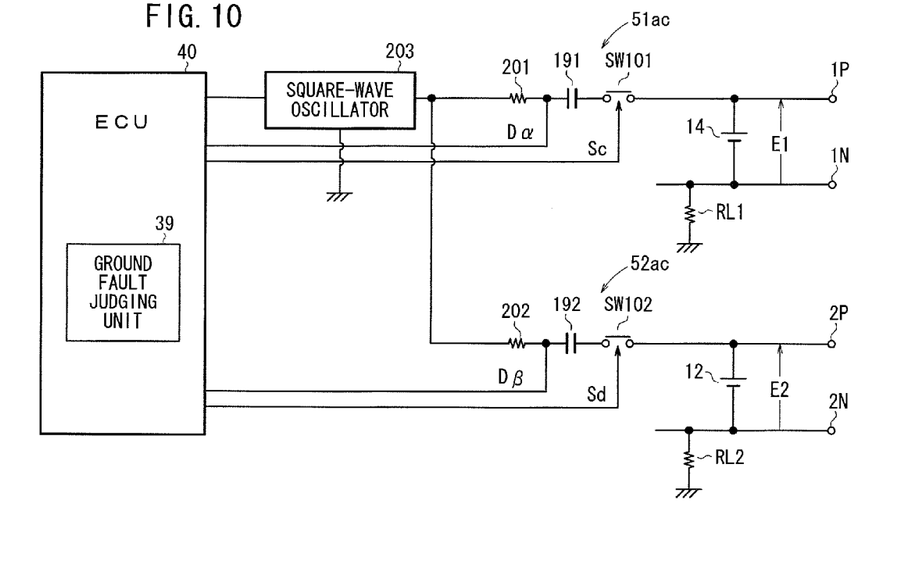
FIG. 10 is a circuit diagram of AC ground fault detectors of the ground fault detecting system.

FIG. 10 is a circuit diagram of the first and second AC ground fault detectors 51ac, 52ac of the ground fault detecting system.

A square-wave oscillator 203 for generating a repetitive square wave having a given frequency generates an AC signal having a constant amplitude (repetitive square-wave signal) at a constant output impedance (e.g., a low impedance with an output buffer).

The AC signal generated by the square-wave oscillator 203 is supplied to the first ungrounded power supply 14 through a first detection resistor 201, a coupling capacitor 191, and a switch SW101 (first switch) of the first AC ground fault detector 51ac.

The repetitive square wave that appears at the junction between the first detection resistor 201 and the coupling capacitor 191 is detected by the ground fault judging unit 39 of the ECU 40.

The AC signal generated by the square-wave oscillator 203 is also supplied to the second ungrounded power supply 12 through a second detection resistor 202, a coupling capacitor 192, and a switch SW102 (second switch) of the second AC ground fault detector 52ac.

The repetitive square wave that appears at the junction between the second detection resistor 202 and the coupling capacitor 192 is detected by the ground fault judging unit 39 of the ECU 40.

According to the AC ground fault detecting system, as disclosed in Japanese Laid-Open Patent Publication No. 08-070503 and Japanese Laid-Open Patent Publication No. 11-218554, the square-wave oscillator 203 is connected to the first ungrounded power supply 14 through the coupling capacitor 191 and to the second ungrounded power supply 12 through the coupling capacitor 192. The AC ground fault detecting system detects the insulation resistance value to determine whether there is a ground fault or not, based on the fact that the crest value (peak-to-peak value or amplitude) of a divided-voltage signal (detected waveform Dα or detected waveform Dβ) drops when the first insulation resistance value RL1 or the second insulation resistance value RL2 drops.

Figure 11:
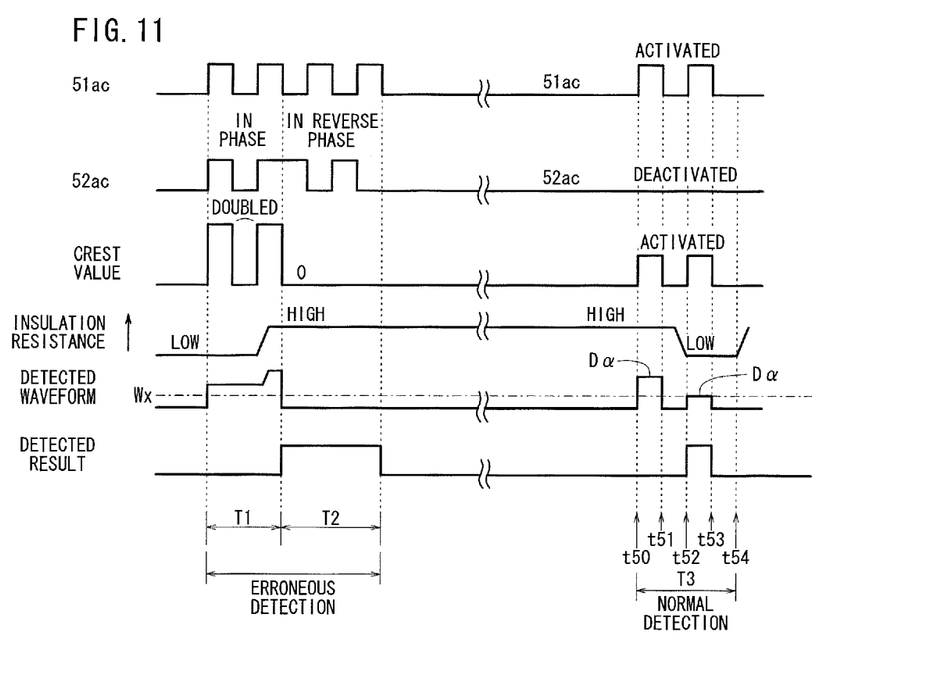
FIG. 11 is a timing chart illustrative of the manner in which the AC ground fault detectors operate at the time of a normal ground fault detection and at the time of an erroneous ground fault detection.

FIG. 11 is a timing chart illustrative of the manner in which the first and second AC ground fault detectors 51ac, 52ac operate. The switch SW101 is closed by an operation signal Sc from the ECU 40 and the switch SW102 remains opened as indicated by a right-hand normal ground fault detection period T3 shown in FIG. 11. In the normal ground fault detection period T3, the first AC ground fault detector 51ac is activated and the second AC ground fault detector 52ac is deactivated, i.e., the switch SW101 is closed and the switch SW102 is open. The crest value of the AC signal which is applied from the square-wave oscillator 203 to the first ungrounded power supply 14 is normal. If the insulation resistance value is high, then the amplitude of the detected waveform Dα in a period from time t50 to time t51 is greater than an abnormal detection threshold value Wx. At this time, the ground fault judging unit 39 judges that there is no ground fault.

If the insulation resistance value is low, then the amplitude of the detected waveform Dα in a period from time t52 to time t53 is smaller than the abnormal detection threshold value Wx. At this time, the ground fault judging unit 39 judges that there is a ground fault. The ground fault judging unit 39 is also capable of normally judging whether there is a ground fault or not if the first AC ground fault detector 51ac is deactivated and the second AC ground fault detector 52ac is activated.

Accordingly, it is possible to normally determine whether there is a ground fault or not when the ECU 40 which functions as a switch controller performs an exclusive switch control process for inhibiting the second switch SW102 from being closed while closing the first switch SW101 and inhibiting the first switch SW101 from being closed while closing the second switch SW102.

Figure 12:
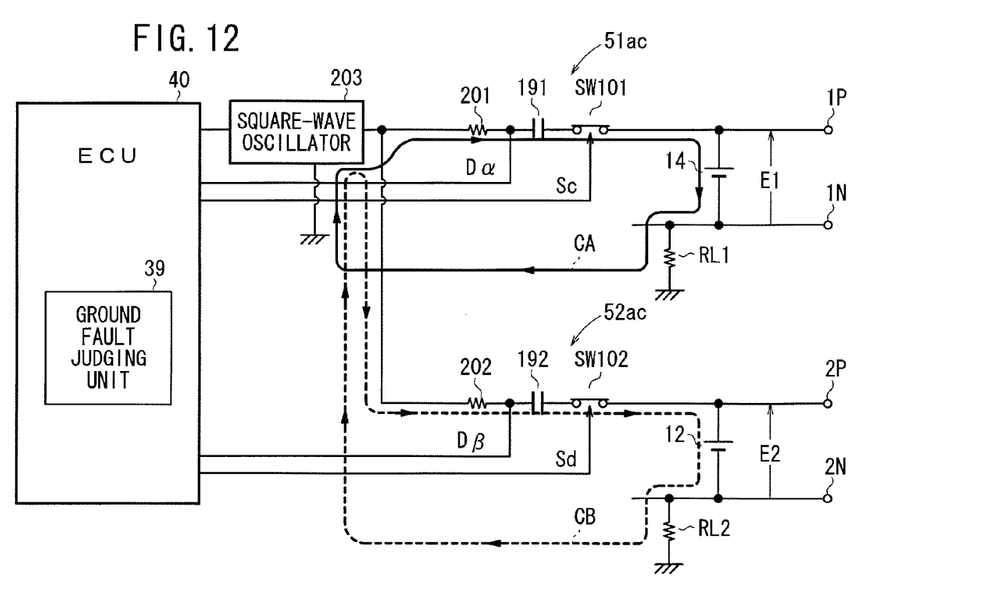
FIG. 12 is a circuit diagram illustrative of the manner in which the AC ground fault detectors operate at the time of an erroneous ground fault detection.

If such an exclusive switch operating process is not carried out, then the first and second switches SW101, SW102 may be closed simultaneously as indicated by left-hand erroneous ground fault detection periods T1, T2 shown in FIG. 11. In such a case, when the detected waveforms Dα, Dβ at the detection points, i.e., the junction between the first detection resistor 201 and the coupling capacitor 191 and the junction between the second detection resistor 202 and the coupling capacitor 192, in closed paths CA, CB shown in FIG. 12 are in phase with each other in the erroneous ground fault detection period T1, the crest value of the AC signal that is applied to the first ungrounded power supply 14 and the second ungrounded power supply 12 is doubled. Since the crest value is high, even when the insulation resistance values RL1, RL2 become low, the detected waveforms remain higher than the abnormal detection threshold value Wx (see FIG. 11). Therefore, the ground fault judging unit 39 is unable to detect the ground fault, or in other words, an erroneous ground fault detection occurs.

Similarly, when the detected waveforms Dα, Dβ at the detection points (the junction between the first detection resistor 201 and the coupling capacitor 191 and the junction between the second detection resistor 202 and the coupling capacitor 192) are in reverse phase with each other in the erroneous ground fault detection period T2, the crest value of the AC signal that is applied to the first ungrounded power supply 14 and the second ungrounded power supply 12 is nil. Even when the insulation resistance values RL1, RL2 are high, the detected waveforms remain lower in level than the abnormal detection threshold value Wx. Therefore, the ground fault judging unit 39 erroneously judges that there is a ground fault, or in other words, an erroneous ground fault detection occurs.

According to the present embodiment, as described above, the ground fault detecting system includes: the first ground fault detector 51dc (51ac) for detecting a ground fault of the first ungrounded power supply 14 based on a change in a circuit impedance before and after the switch SW2 (SW101) is opened and closed, the first ground fault detector 51dc (51ac) having the first insulation resistor RL1 inserted between the first ungrounded power supply 14 and the grounded region (vehicle body) and connected to an end of the first detection resistor 101 (201) through the first switch SW2 (SW101), the first detection resistor 101 (201) having another end connected to the grounded region or the square-wave oscillator 203 (AC signal source); the second ground fault detector 52dc (52ac) for detecting a ground fault of the second ungrounded power supply 12 based on a change in a circuit impedance before and after the second switch SW21 (SW102) is opened and closed, the second ground fault detector 52dc (52ac) having the second insulation resistor RL2 inserted between the second ungrounded power supply 12 and the grounded region and connected to an end of the second detection resistor 111 (202) through the second switch SW21 (SW102), the second detection resistor 111 (202) having another end connected to the grounded region or the square-wave oscillator 203; and the ECU 40 (switch controller) for performing an exclusive switch operating process for inhibiting the second switch SW21 (SW102) from being closed when the first switch SW2 (SW101) is closed and inhibiting the first switch SW2 (SW101) from being closed when the second switch SW21 (SW102) is closed.

The first and second ground fault detectors 51, 52 are associated respectively with the first and second ungrounded power supplies 14, 12 which generate the respective different voltages E1, E2. Since the first and second ground fault detectors 51, 52 are activated in different periods, the ground fault detecting system is capable of preventing a ground fault from being detected in error.

Figure 13:
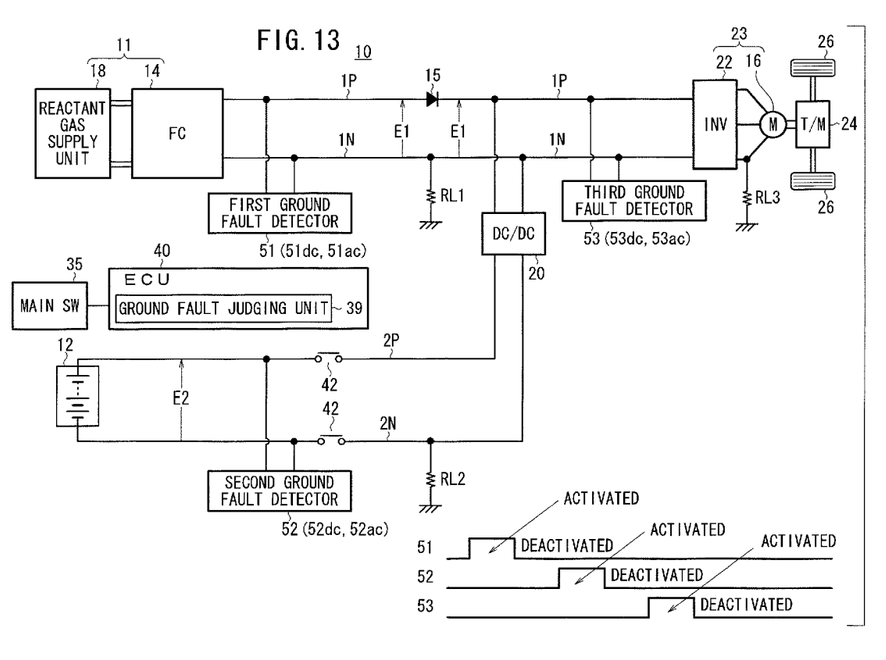
FIG. 13 is a block diagram of an electric vehicle incorporating a ground fault detecting system according to another embodiment of the present invention.

FIG. 13 shows in block form an electric vehicle 10 incorporating a ground fault detecting system according to another embodiment of the present invention. Those parts of the ground fault detecting system shown in FIG. 13 which are identical to those of the ground fault detecting system shown in FIG. 1 are denoted by identical reference characters, and will not be described in detail below. In the ground fault detecting system shown in FIG. 13, a third ground fault detector 53 (53dc or 53ac) is connected to the input of the inverter 22 for measuring an insulation resistance value RL3. The ECU 40 actuates the first, second, and third ground fault detectors 51, 52, 53 in different periods to measure the first, second, and third insulation resistance values RL1, RL2, RL3.

Although certain preferred embodiments of the present invention have been shown and described in detail, it should be understood that various changes and modifications may be made therein without departing from the scope of the appended claims.

What is claimed is:
1. An electric vehicle incorporating a ground fault detecting system, which includes a load, a first ungrounded power supply having a voltage for supplying electric power to the load, a converter having input and output terminals connected between the load and the first ungrounded power supply, and a second ungrounded power supply having a voltage lower than the voltage of the first ungrounded power supply and which is connected to other input and output terminals of the converter, the ground fault detecting system comprising:
a first ground fault detector for detecting a ground fault of the first ungrounded power supply based on a change in a circuit impedance before and after a first switch is opened and closed, the first ground fault detector having a first insulation resistor inserted between the first ungrounded power supply and a grounded region, the first insulation resistor being connected to an end of a first detection resistor through the first switch, the first detection resistor having another end connected to the grounded region or an AC signal source which generates an AC signal;
a second ground fault detector for detecting a ground fault of the second ungrounded power supply based on a change in a circuit impedance before and after a second switch is opened and closed, the second ground fault detector having a second insulation resistor inserted between the second ungrounded power supply and the grounded region, the second insulation resistor being connected to an end of a second detection resistor through the second switch, the second detection resistor having another end connected to the grounded region or the AC signal source; and
a switch controller for performing an exclusive switch control process for inhibiting the second switch from being closed when the first switch is closed and inhibiting the first switch from being closed when the second switch is closed.

2. An electric vehicle according to claim 1, wherein the first ground fault detector comprises an AC ground fault detector for detecting a ground fault of the first ungrounded power supply based on a divided-voltage signal of the AC signal divided by the first detection resistor and the first insulation resistor; and
the second ground fault detector comprises an AC ground fault detector for detecting a ground fault of the second ungrounded power supply based on a divided-voltage signal of the AC signal divided by the second detection resistor and the second insulation resistor.

3. An electric vehicle according to claim 1, wherein the first ground fault detector comprises a DC ground fault detector for measuring a voltage change or a current change based on the change in the circuit impedance before and after the first switch is opened and closed; and the second ground fault detector comprises a DC ground fault detector for measuring a voltage change or a current change based on the change in the circuit impedance before and after the second switch is opened and closed.

4. An electric vehicle according to claim 1, wherein the first ungrounded power supply comprises a fuel cell.

5. An electric vehicle according to claim 1, wherein the second ungrounded power supply comprises an electric energy storage.

* * * * *